(12) United States Patent
Yamada

(10) Patent No.: US 7,474,380 B2
(45) Date of Patent: Jan. 6, 2009

(54) PROJECTION OPTICAL SYSTEM, EXPOSURE APPARATUS, AND DEVICE FABRICATION METHOD

(75) Inventor: Akihiro Yamada, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/038,026

(22) Filed: Feb. 27, 2008

(65) Prior Publication Data

US 2008/0212058 A1   Sep. 4, 2008

(30) Foreign Application Priority Data

Mar. 1, 2007   (JP)   ............................. 2007-051936

(51) Int. Cl.
  *G03B 27/42* (2006.01)
  *G03B 27/52* (2006.01)
  *G02B 5/30* (2006.01)

(52) U.S. Cl. .......................... 355/53; 355/30; 359/494; 359/497

(58) Field of Classification Search ................... 355/30, 355/53; 359/494, 497, 499
See application file for complete search history.

(56) References Cited

U.S. PATENT DOCUMENTS

| 7,057,708 | B2 | 6/2006 | Yamada | |
|---|---|---|---|---|
| 2004/0105170 | A1* | 6/2004 | Krahmer et al. | 359/726 |
| 2005/0180023 | A1* | 8/2005 | Totzeck et al. | 359/649 |
| 2007/0091451 | A1* | 4/2007 | Schuster | 359/649 |
| 2008/0043331 | A1* | 2/2008 | Kraehmer et al. | 359/497 |
| 2008/0165336 | A1* | 7/2008 | Omura et al. | 355/66 |

FOREIGN PATENT DOCUMENTS

| EP | 1783525 A1 | 5/2007 |
|---|---|---|
| EP | 1890193 A1 | 2/2008 |
| JP | 2004-045692 A | 2/2004 |
| JP | 2006-113533 A | 4/2006 |
| WO | 02/093209 A2 | 11/2002 |
| WO | 2004/023172 A1 | 3/2004 |
| WO | 2006/089919 A1 | 8/2006 |

OTHER PUBLICATIONS

Shiraishi et al, "Progress of Nikon's F2 Exposure Tool Development", Optical Microlithography XV, Anthony Yan, Editor, Proceedings of SPIE vol. 4691 (2002), pp. 594-601, XP008010023.

European Patent Office Communication in application No. 08152056.1 dated Jun. 17, 2008 with Search Report.

* cited by examiner

*Primary Examiner*—Alan A Mathews
(74) *Attorney, Agent, or Firm*—Morgan & Finnegan LLP

(57) ABSTRACT

The present invention provides a projection optical system which projects an image on a first object plane onto a second object plane, comprising a plurality of optical members inserted in turn from a side of the second object plane, said plurality of optical members being made of an isotropic crystal and including a first optical member and second optical member in each of which <1 1 1> crystal axes are oriented in a direction of an optical axis and a third optical member in which <1 0 0> crystal axes are oriented in the direction of the optical axis, wherein maximum angles $\theta 1$, $\theta 2$, and $\theta 3$ between the optical axis and light beams passing through said first optical member, said second optical member, and said third optical member, respectively, satisfy $|\theta i - \theta j| < 5°$ (i, j=1, 2, 3).

13 Claims, 14 Drawing Sheets

0.41waves

PROJECTION OPTICAL SYSTEM, EXPOSURE APPARATUS, AND DEVICE FABRICATION METHOD

BACKGROUND OF THE INVENTION

1. Field of the Invention

The present invention relates to a projection optical system, an exposure apparatus, and a device fabrication method.

2. Description of the Related Art

A projection exposure apparatus has conventionally been employed to fabricate, for example, a micropatterned semiconductor device such as a semiconductor memory or logic circuit by using photolithography. The projection exposure apparatus transfers a circuit pattern formed on a reticle (mask) onto, for example, a wafer via a projection optical system.

A minimum dimension (resolution) with which the projection exposure apparatus can transfer is proportional to the wavelength of exposure light and is inversely proportional to the numerical aperture (NA) of a projection optical system. Along with the recent demand for micropatterning semiconductor devices, the wavelength of the exposure light is shortening and the NA of the projection optical system is increasing. For example, to shorten the wavelength of the exposure light, a KrF excimer laser (wavelength: about 248 nm) has conventionally been used as the exposure light. In recent years, however, an ArF excimer (wavelength: about 193 nm) is used as the exposure light. To increase the NA of the projection optical system, a projection optical system having a numerical aperture more than 0.9 has been developed. In recent years, however, a projection optical system (immersion projection optical system) which uses an immersion exposure technique and has a numerical aperture more than 1.0 has been proposed. The immersion exposure technique further increases the NA of the projection optical system by filling the space between the wafer and a final lens (final surface) of the projection optical system with a liquid.

The immersion projection optical system generally uses pure water as a liquid which fills the space between the final lens and the wafer, and uses quartz as the glass material of the final lens. From the viewpoint of the arrangement of this system, the limit value of the numerical aperture is about 1.35. Under these circumstances, it has been proposed to increase the numerical aperture to 1.5 or 1.65 or more by using a liquid having a refractive index higher than that of pure water and a glass material having a refractive index higher than that of quartz.

At present, LuAG ($Lu_3Al_5O_{12}$) is receiving a great deal of attention as a glass material which transmits light having a wavelength of 193 nm and has a refractive index higher than that of quartz. Since, however, LuAG is a crystal glass material, it shows birefringence attributed to its crystal structure. As the refractive index of LuAG increases, the birefringence of LuAG attributed to its crystal structure also increases. For example, $CaF_2$ (calcium fluoride) has a refractive index of 1.506 with respect to light having a wavelength of 193 nm, and has a maximum birefringence of 3.4 nm/cm attributed to its crystal structure. On the other hand, LuAG has a refractive index of 2.14 with respect to light having a wavelength of 193 nm, and has a maximum birefringence of 30 nm/cm attributed to its crystal structure.

When the immersion projection optical system has a numerical aperture more than 1.0, the surface (the surface directly above the wafer) of the final lens on the wafer side is generally made flat to stably control the liquid between the final lens and the wafer. When a numerical aperture NA of the projection optical system and a refractive index nFL of the final lens are determined, a maximum angle $\theta MX$ between the optical axis of the projection optical system and a light beam passing through the final lens is defined by:

$$\theta MX > \arcsin(NA/nFL) \times 180/\Pi [°] \qquad (1)$$

FIG. 13 shows the dependence of an angle $\theta FL$ between the optical axis of the projection optical system and a light beam passing through the final lens upon the numerical aperture when the glass material of the final lens is LuAG (refractive index: 2.14). In FIG. 13, the ordinate indicates the angle $\theta FL$, and the abscissa indicates the numerical aperture of the projection optical system. Referring to FIG. 13, the angle $\theta FL$ is 44.5° when the numerical aperture is 1.5, while it is 50° when the numerical aperture is 1.65.

FIGS. 14A and 14B each show the birefringence distribution of an isotropic crystal glass material (flat shape) attributed to its crystal structure. FIG. 14A shows a birefringence distribution around the <1 1 1> crystal axis (crystal orientation). FIG. 14B shows a birefringence distribution around the <1 0 0> crystal axis (crystal orientation). In FIGS. 14A and 14B, each position along the radial direction indicates the passage angle of a light beam, and each position along the azimuth direction indicates the passage orientation angle of the light beam. The length of each short line indicates the relative birefringence amount, and the direction of the short line indicates the fast axis orientation of birefringence.

Referring to FIGS. 14A and 14B, the birefringence of the isotropic crystal glass material attributed to its crystal structure is zero in the <1 0 0> crystal axis orientation and <1 1 1> crystal axis orientation, and it takes a maximum value in the <1 1 0> crystal axis orientation. Hence, when the <1 0 0> crystal axes and <1 1 1> crystal axes are oriented along the optical axis of the projection optical system, the passage angle of the light beam increases as the numerical aperture increases, resulting in an increase in birefringence attributed to the crystal structure.

To correct the birefringence attributed to the crystal structure, there has been proposed a technique of forming other lenses of the projection optical system using the same crystal glass material as used for the final lens or a crystal glass material having nearly the same birefringence as that used for the final lens, and controlling the assembly angle of the crystal glass material around the optical axis. There has conventionally been proposed another technique of correcting the birefringence attributed to the crystal structure. Japanese Patent Laid-Open Nos. 2004-45692 and 2006-113533 can be referred to as these techniques.

Unfortunately, since LuAG used for the final lens of the projection optical system is very expensive, it is desirable to avoid using it for other lenses of the projection optical system as much as possible. Furthermore, since LuAG has a low transmittance (has high light absorption) and its refractive index greatly changes in response to a change in temperature, it is also desirable to avoid using LuAG as much as possible to suppress aberration fluctuation in exposure.

Japanese Patent Laid-Open No. 2004-45692 discloses a technique of efficiently correcting the birefringence attributed to the crystal structure by orienting the <1 0 0> crystal axes of a crystal glass material exhibiting a maximum angle of 30° or more between a passing light beam and the optical axis of the projection optical system along the optical axis of the projection optical system. However, Japanese Patent Laid-Open No. 2004-45692 does not take account of a high refractive index material which has a very large birefringence (e.g., has a birefringence more than 20 nm/cm) attributed to its crystal structure. It is difficult to correct the birefringence of such a high refractive index material attributed to its crystal structure unless not only the condition of a crystal glass material in which the <1 0 0> crystal axes are oriented along the optical axis of the projection optical system but also the condition of a crystal glass material in which the <1 1 1> crystal axes are oriented along the optical axis of the projection optical system is defined.

Japanese Patent Laid-Open No. 2006-113533 discloses a technique of correcting the birefringence of a high refractive index crystal glass material attributed to its crystal structure by forming the final lens and lenses adjacent to it using MgO (magnesium oxide) and CaO (calcium oxide) having birefringences of opposite signs attributed to their crystal structures. However, Japanese Patent Laid-Open No. 2006-113533 does not define concrete arrangements of the crystal axes of MgO and CaO, which allow reduction in birefringence attributed to the crystal structure. In practice, high-quality MgO and CaO which can be used for the exposure apparatus neither exist nor are under development.

SUMMARY OF THE INVENTION

The present invention provides a projection optical system which prevents an increase in cost and achieves excellent imaging performance by reducing the influence of birefringence attributed to the crystal structure.

According to one aspect of the present invention, there is provided a projection optical system which projects an image on a first object plane onto a second object plane, comprising a plurality of optical members inserted in turn from a side of the second object plane, the plurality of optical members being made of an isotropic crystal and including a first optical member and second optical member in each of which <1 1 1> crystal axes are oriented in a direction of an optical axis and a third optical member in which <1 0 0> crystal axes are oriented in the direction of the optical axis, wherein maximum angles $\theta1$, $\theta2$, and $\theta3$ between the optical axis and light beams passing through the first optical member, the second optical member, and the third optical member, respectively, satisfy $|\theta i - \theta j| < 5°$ (i, j=1, 2, 3).

According to another aspect of the present invention, there is provided a projection optical system which projects an image on a first object plane onto a second object plane, comprising a plurality of optical members inserted in turn from a side of the second object plane, the plurality of optical members being made of an isotropic crystal and including a first optical member and second optical member in each of which <1 1 1> crystal axes are oriented in a direction of an optical axis and a third optical member and fourth optical member in each of which <1 0 0> crystal axes are oriented in the direction of the optical axis, wherein maximum angles $\theta1$, $\theta2$, $\theta3$, and $\theta4$ between the optical axis and light beams passing through the first optical member, the second optical member, the third optical member, and the fourth optical member, respectively, satisfy $|\theta i - \theta j| < 5°$ (i, j=1, 2, 3, 4).

According to still another aspect of the present invention, there is provided an exposure apparatus comprising an illumination optical system configured to illuminate a reticle with light from a light source, and the above projection optical system, which is configured to project a pattern image of the reticle onto a substrate.

According to yet another aspect of the present invention, there is provided a device fabrication method comprising steps of exposing a substrate using the above exposure apparatus, and performing a development process for the substrate exposed.

Further aspects or features of the present invention will become apparent from the following description of exemplary embodiments with reference to the attached drawings.

DESCRIPTION OF THE EMBODIMENTS

Figure 1:
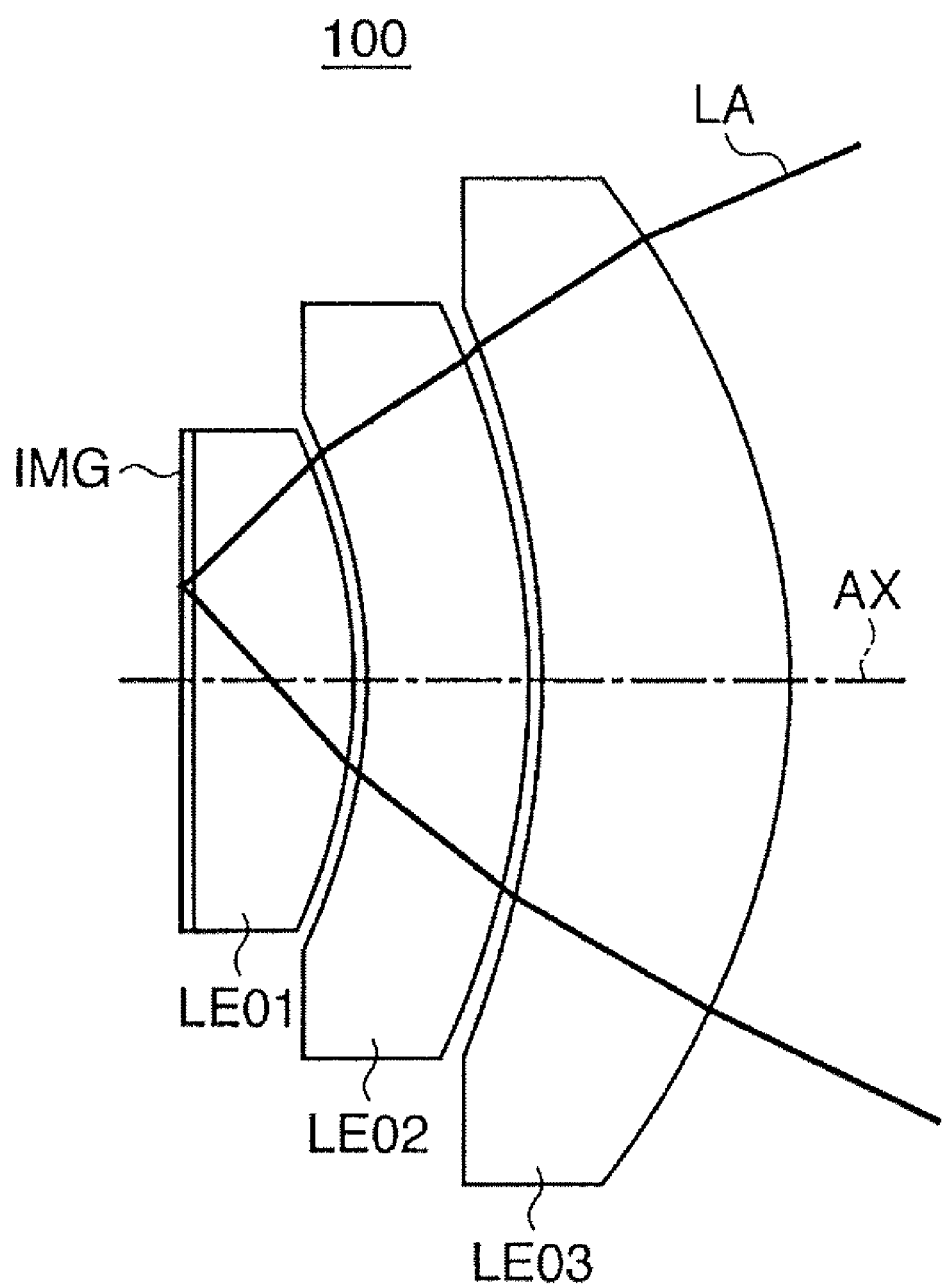
FIG. 1 is a schematic sectional view of a projection optical system according to one aspect of the present invention.

Preferred embodiments of the present invention will be described below with reference to the accompanying drawings. The same reference numerals denote the same constituent members throughout the drawings, and a repetitive description thereof will be omitted.

FIG. 1 is a schematic sectional view of a projection optical system 100 according to one aspect of the present invention. FIG. 1 shows optical members (lenses) near a wafer, which form the projection optical system 100. In FIG. 1, reference symbol AX indicates the optical axis of the projection optical system 100, and reference symbol IMG indicates a second object plane corresponding to the wafer surface.

The projection optical system 100 projects an image on a first object plane (reticle pattern) onto the second object plane IMG. As shown in FIG. 1, the projection optical system 100 includes a plurality of optical members (in this embodiment, optical members LE01, LE02, and LE03) inserted in turn from the side of the second object plane IMG. The projection optical system 100 is an immersion projection optical system in which the space between the second object plane IMG and the optical member LE01 of the projection optical system 100 is filled with a liquid having a high refractive index.

The optical members LE01 to LE03 are made of high refractive index isotropic crystals such as LuAG. The <1 1 1> crystal axes of two of the optical members LE01 to LE03 are oriented along the optical axis AX, while the <1 0 0> crystal axes of the remaining one optical member are oriented along the optical axis AX. When two members in each of which the <1 1 1> crystal axes are oriented along the optical axis are assembled around the optical axis at different relative angles, it is possible to cancel and reduce asymmetrical components of the birefringence distributions in the pupil. In addition, when one member in which the <1 0 0> crystal axes are oriented along the optical axis is assembled around the optical axis, it is possible to cancel and reduce rotationally symmetrical components of the birefringence distributions in the pupil, which reinforce each other on the two members in each of which the <1 1 1> crystal axes are oriented along the optical axis. In this manner, at least two optical members in each of which the <1 1 1> crystal axes are oriented along the optical axis AX and at least one optical member in which the <1 0 0> crystal axes are oriented along the optical axis AX are used. This makes it possible to cancel the birefringences of the respective optical members.

Figure 2:
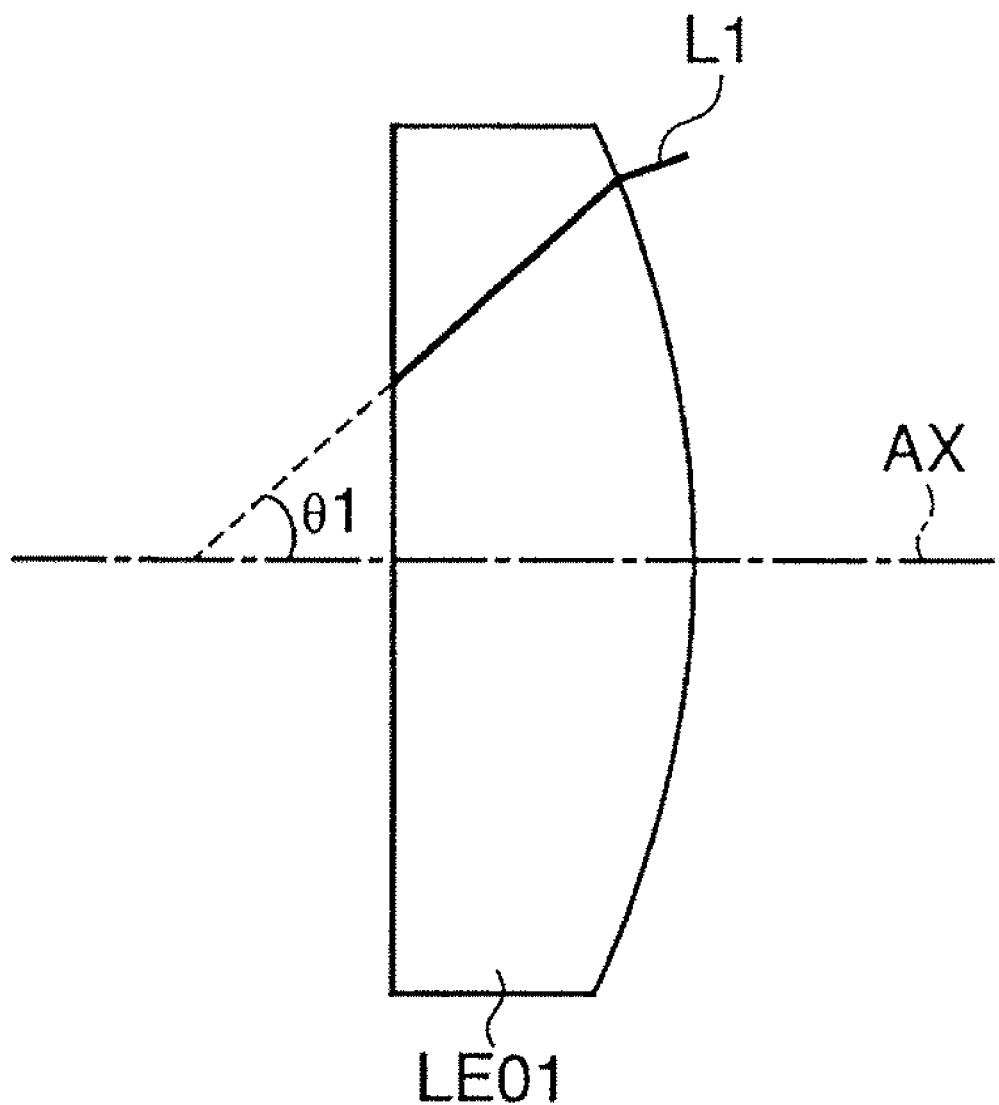
FIG. 2 is a view showing the maximum angle between the optical axis of the projection optical system and a light beam passing through an optical member of the projection optical system shown in FIG. 1.
Figure 3:
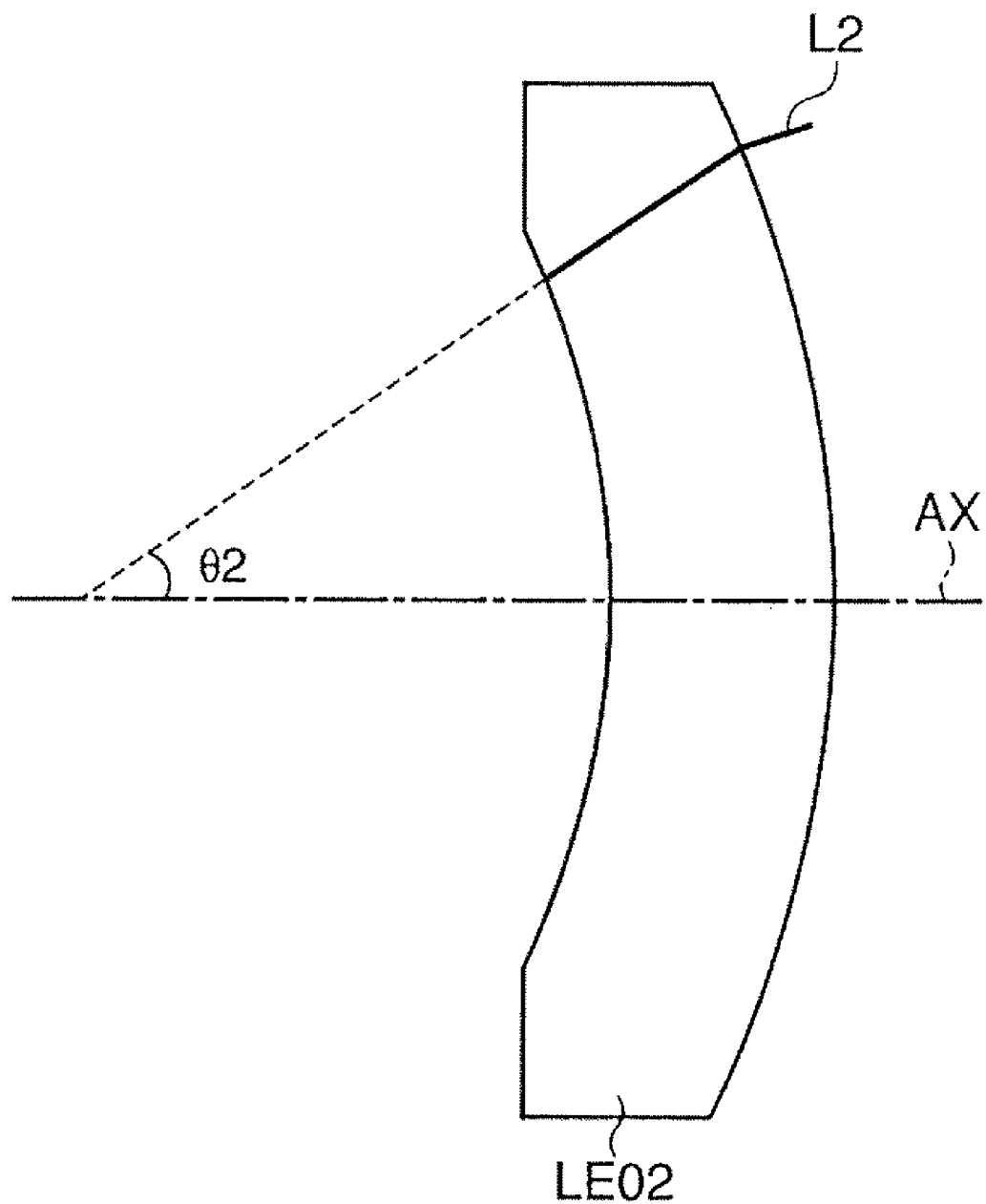
FIG. 3 is a view showing the maximum angle between the optical axis of the projection optical system and a light beam passing through another optical member of the projection optical system shown in FIG. 1.
Figure 4:
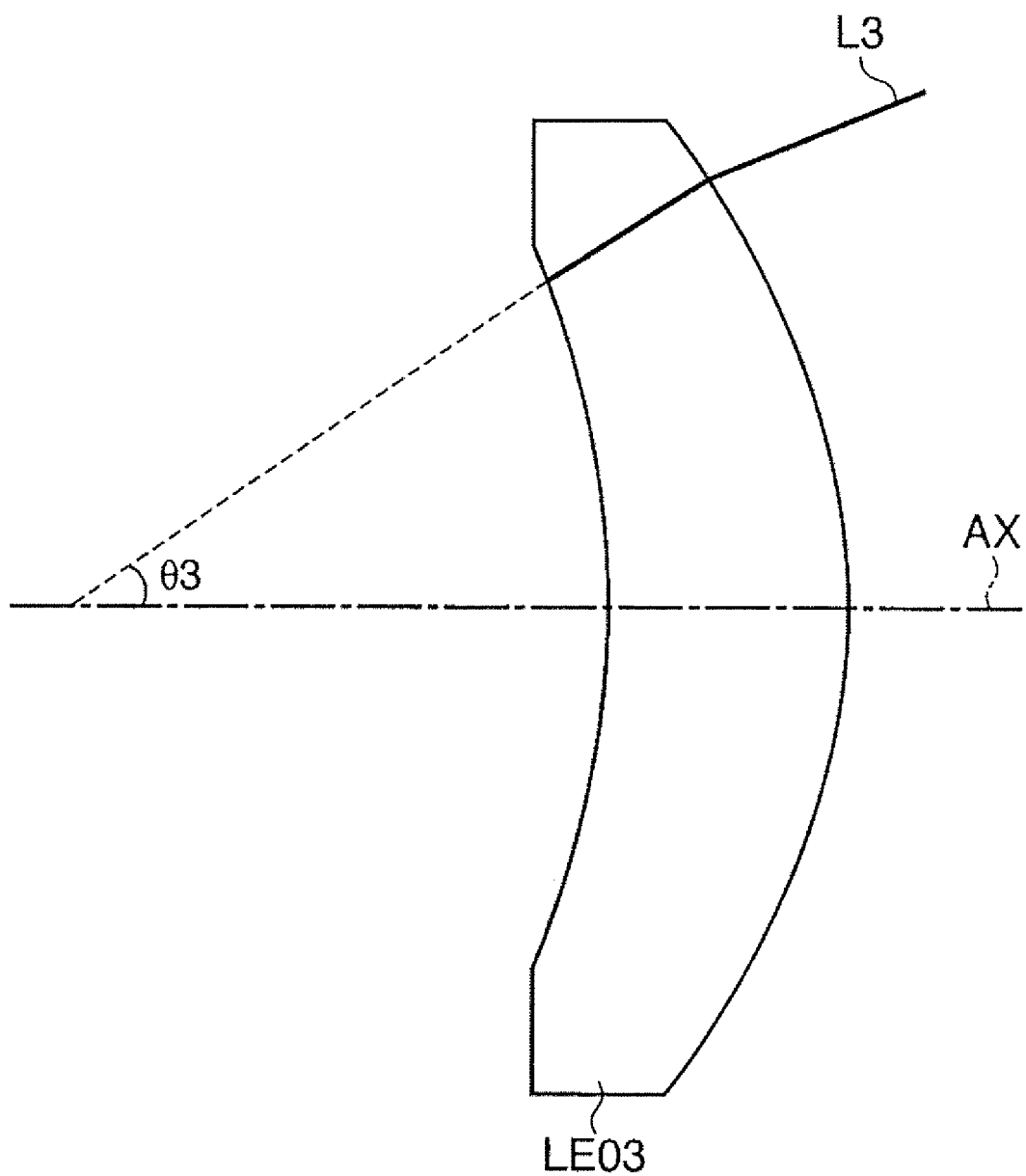
FIG. 4 is a view showing the maximum angle between the optical axis of the projection optical system and a light beam passing through still another optical member of the projection optical system shown in FIG. 1.

FIG. 1 shows a light beam LA at a maximum image height, which includes a light beam component which forms a maximum angle with the optical axis AX of light beams (passing light beams) passing through the optical members LE01 to LE03. FIG. 2 shows a maximum angle $\theta 1$ between the optical axis AX and a light beam passing through the optical member LE01. Likewise, FIG. 3 shows a maximum angle $\theta 2$ between the optical axis AX and a light beam L2 passing through the optical member LE02, and FIG. 4 shows a maximum angle $\theta 3$ between the optical axis AX and a light beam L3 passing through the optical member LE03.

The maximum angles $\theta 1$, $\theta 2$, and $\theta 3$ in the optical members LE01, LE02, and LE03, respectively, of the projection optical system 100 satisfy:

$$|\theta i - \theta j| < 5° \ (i,j=1,2,3) \tag{2}$$

When the projection optical system 100 satisfies the above-described condition associated with the optical members LE01 to LE03, it is possible to cancel birefringences more than 20 nm/cm, if any, in the optical members LE01 to LE03 attributed to their crystal structures. In other words, it is possible to reduce the birefringences of the three optical members LE01 to LE03 attributed to their crystal structures.

When an optical member directly above the optical member LE03 of the projection optical system 100 is made of an isotropic crystal, it is possible to satisfactorily correct the birefringence attributed to the crystal structure. In this case, an angle $\theta$max largest of the maximum angles $\theta 1$ to $\theta 3$ in the optical members LE01 to LE03, and a maximum angle $\theta 4$ between the optical axis AX and a light beam passing through the optical member directly above the optical member LE03 preferably satisfy:

$$|\theta max - \theta 4| < 10° \tag{3}$$

This makes it possible to more satisfactorily correct the birefringence attributed to the crystal structure.

A projection optical system 100 according to the present invention will be explained in detail below.

Figure 5:
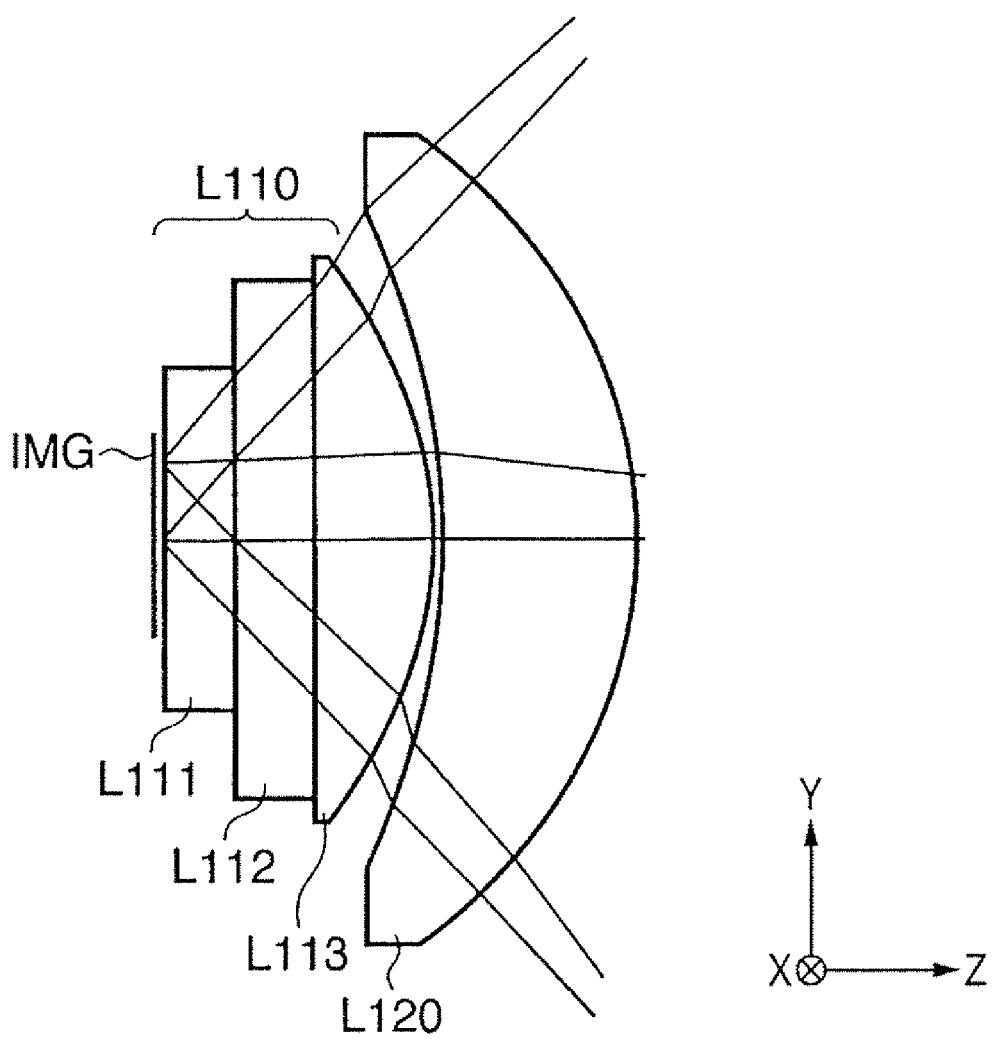
FIG. 5 is a schematic sectional view of a projection optical system according to a first embodiment of the present invention.

FIG. 5 is a schematic sectional view of a projection optical system 100 according to a first embodiment. FIG. 5 shows lenses near a second object plane (wafer surface) IMG, which form the projection optical system 100. The projection optical system 100 according to the first embodiment is a catadioptric system which has a numerical aperture (NA) of 1.55 and includes a plurality of lenses and at least one reflecting member. The projection optical system 100 according to the first embodiment includes a final lens (lens group) L110 including parallel plates L111 and L112 and planoconvex lens L113, and an aspherical lens L120, which are inserted in turn from the side of the second object plane IMG. The parallel plates L111 and L112 and planoconvex lens L113 are made of LuAG, while the aspherical lens L120 is made of $CaF_2$. Other lenses (not shown) of the projection optical system 100 according to the first embodiment are made of quartz.

The projection optical system 100 according to the first embodiment can use an image height ranging from 3.125 mm to 16.625 mm (an object height ranging from 12.5 mm to 66.5 mm), ensuring a slit effective area of 26×7 mm. The numerical specification of the projection optical system 100 according to the first embodiment is shown in the following Table 1. Referring to Table 1, the first column shows the surface number assigned along a direction opposite to the direction the light travels from the second object plane IMG. The second column shows the radius (mm) of curvature of each surface corresponding to the surface number. The third column shows the on-axis interval (mm) of each surface. The fourth column shows the type of glass material of each surface. The curvature of each surface shown in the second column is positive if it is convex on the side of the first object plane.

TABLE 1

NA = 1.55, (maximum image height) = 16.625 mm

| surface number | radius of curvature | on-axis interval | type of glass material | |
|---|---|---|---|---|
| 1 | second object plane | 1.000000 | | |
| 2 | flat | 14.042980 | LuAG | L111 |
| 3 | flat | 0.000000 | | |
| 4 | flat | 16.589870 | LuAG | L112 |
| 5 | flat | 0.000000 | | |
| 6 | flat | 26.367150 | LuAG | L113 |
| 7 | 87.00000 | 1.00000 | | |
| 8 | 196.24806 (aspherical surface) | 42.366835 | $CaF_2$ | L120 |
| 9 | 104.60882 | | | |

The shape of the aspherical surface of surface number 8 is shown in the following Table 2. The shape of the aspherical surface is given by $X = (H^2/4)/(1+((1-(1+k)\cdot(H/r)^2))^{1/2}) + AH^4 + BH^6 + CH^8 + DH^{10} + EH^{12}$, wherein X is the amount of displacement from the lens vertex in the optical axis direction, H is the distance from the optical axis, k is a cone constant, and A, B, C, D, and E are aspherical surface coefficients.

TABLE 2 surface number 8

K = 1.198546261720e+000
A = 1.317885777050e−008
B = 1.203775426570e−011

TABLE 2-continued surface number 8

C = −8.534206855010e−016
D = 1.342134448950e−019
E = −1.049423473350e−023

In the projection optical system 100 according to the first embodiment, the space between the second object plane IMG and the final lens L110 (parallel plate L111) is filled with a liquid having a refractive index of 1.85.

As described above, the final lens L110 is a lens group which includes the two parallel plates L111 and L112 and the planoconvex lens L113 having a positive focal length and has a positive focal length as a whole. Liquid layers having refractive indices greater than or equal to the numerical aperture of the lens may be formed between the parallel plates L111 and L112 and between the parallel plate L112 and the planoconvex lens L113. However, it is difficult to control a large number of liquid layers. The parallel plates L111 and L112 and planoconvex lens L113 may be bonded using an adhesive. However, the durability of the adhesive with respect to an excimer laser and a change in aberration due to the presence of the adhesive become problematic. The parallel plates L111 and L112 and planoconvex lens L113 of the projection optical system 100 according to the first embodiment are bonded by optical contact. This also has an advantage of simplifying the arrangement of a lens holding mechanism which holds the parallel plates L111 and L112 and planoconvex lens L113 (i.e., the final lens L110). The "optical contact" here means a technique of highly smoothing the surfaces of the parallel plates L111 and L112 and planoconvex lens L113 and bonding them using the Van der Waals force.

As described above, the parallel plates L111 and L112 and planoconvex lens L113 of the projection optical system 100 according to the first embodiment are made of LuAG having a refractive index of 2.14 with respect to light having a wavelength of 193 nm.

All of maximum angles $\theta 1$, $\theta 2$, and $\theta 3$ between the optical axis AX and light beams passing through the parallel plates L111 and L112 and planoconvex lens L113, respectively, are 46.4°. Hence, the projection optical system 100 according to the first embodiment satisfies inequality (2).

The <1 0 0> crystal axes of the parallel plate L111 are oriented along the optical axis AX (optical axis direction), and its <0 1 0> crystal axes are oriented along the Y-axis direction. In FIG. 5, a right-handed coordinate system is defined such that the direction perpendicular to the paper is the X-axis (the direction coming out of the paper is the plus direction).

The <1 1 1> crystal axes of the parallel plate L112 are oriented along the optical axis AX (optical axis direction). The parallel plates L111 and L112 are arranged such that the relative angle between images of crystal planes along the <0 1 0> crystal axes of the parallel plate L111 and the <1 0 0> crystal axes of the parallel plate L112, which are projected onto a plane perpendicular to the optical axis, becomes 45° around the optical axis.

The <1 1 1> crystal axes of the planoconvex lens L113 are oriented along the optical axis AX (optical axis direction). The parallel plate L112 and planoconvex lens L113 are arranged such that the relative angle between images of crystal planes along the <1 0 0> crystal axes of the parallel plates L112 and L113, which are projected onto a plane perpendicular to the optical axis, becomes 60° around the optical axis.

With the above-described arrangement, the projection optical system 100 according to the first embodiment can reduce the birefringence of the final lens L110 attributed to its crystal structure.

Figure 14A:
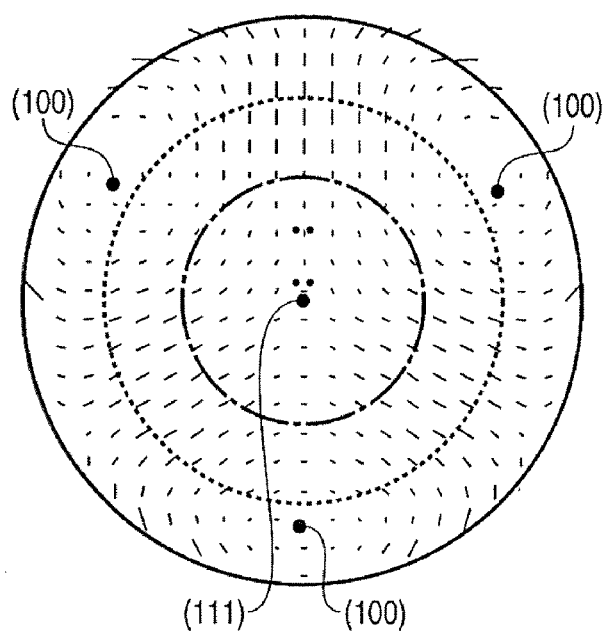
FIGS. 14A and 14B are views each showing the birefringence distribution of an isotropic crystal glass material attributed to its crystal structure.
Figure 14B:
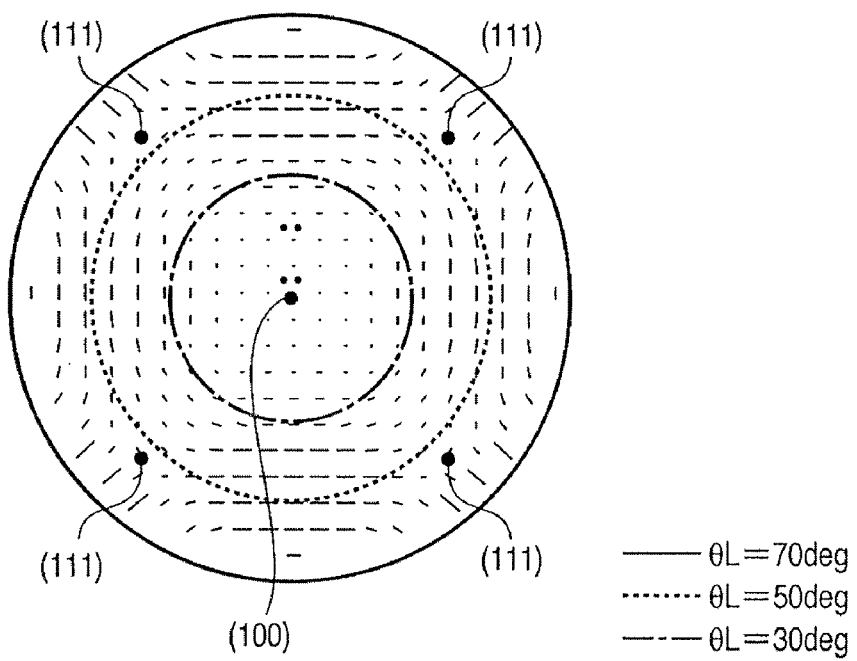

When the projection optical system according to the first embodiment satisfies inequality (2), it is possible to decrease the angular difference between the optical axis AX and a light beam passing through each of the parallel plates L111 and L112 and planoconvex lens L113. As shown in FIGS. 14A and 14B, the amount of birefringence of an isotropic crystal attributed to its crystal structure changes depending on the passage angle of a light beam. When the <1 1 1> crystal axes or <1 0 0> crystal axes of the isotropic crystal are oriented in the optical axis direction, the amount of birefringence increases as the passage angle of a light beam increases. Assume that the projection optical system does not satisfy inequality (2), and the angular difference between the optical axis AX and a light beam passing through each of the parallel plates L111 and L112 and planoconvex lens L113 increases by a considerable degree. In this case, the amount of birefringence in the pupil of a light beam corresponding to each image point greatly changes between the respective optical members. This reduces an effect of defining the crystal axes (crystal orientations) and assembly angles of the parallel plates L111 and L112 and planoconvex lens L113 and correcting the birefringence of the final lens L110, and it becomes difficult to satisfactorily cancel the birefringences. Therefore, the amount of birefringence of the final lens L110 attributed to its crystal structure increases. This makes it impossible to reduce the amount of birefringence of the overall projection optical system 100 unless high refractive index crystal glass materials are used for many of the other optical members (lenses) of the projection optical system 100. In contrast, since the projection optical system 100 according to the first embodiment satisfies inequality (2), the passage angles of light beams with respect to the parallel plates L111 and L112 and planoconvex lens L113 become nearly equal to each other. This makes it possible to efficiently correct the birefringence of the final lens L110 attributed to its crystal structure.

The orientations of the crystal axes of the parallel plates L111 and L112 and planoconvex lens L113 along the optical axis AX vary due to, for example, fabrication errors. For this reason, an angle (i.e., a deviation between the optical axis AX and the crystal axes of each optical member) α between the optical axis AX and the crystal axes of each of the parallel plates L111 and L112 and planoconvex lens L113, which are oriented along the optical axis AX, preferably satisfies:

$$|\alpha|<2.0°  \quad (4)$$

If the angle α does not satisfy inequality (4), it is impossible to obtain a satisfactory effect of correcting the birefringence of the final lens L110 attributed to its crystal structure.

Figure 6A:
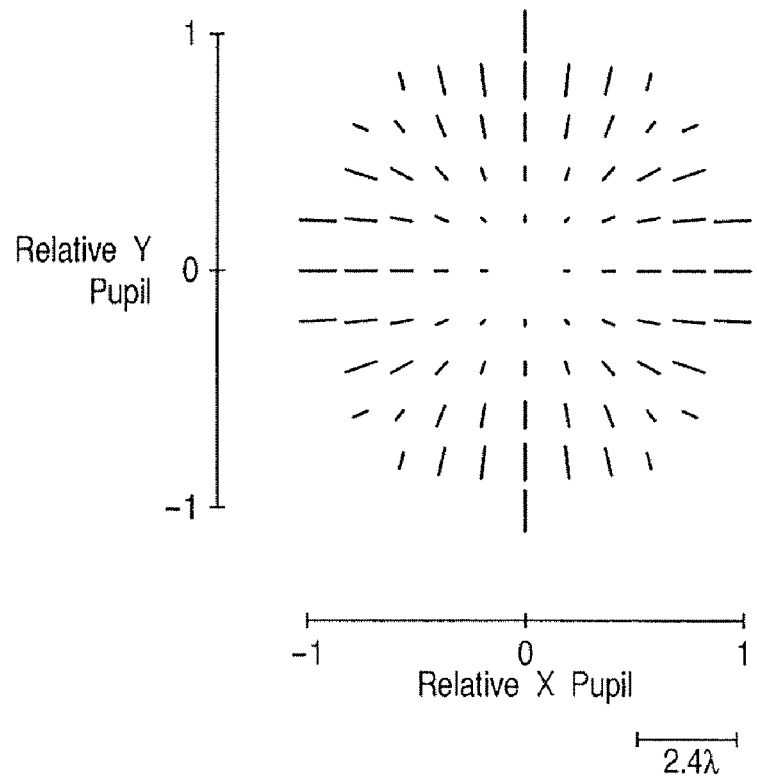
FIGS. 6A and 6B are diagrams each showing a retardance distribution in the pupil, which is formed by the birefringence of a final lens of the projection optical system according to the first embodiment attributed to its crystal structure.
Figure 6B:
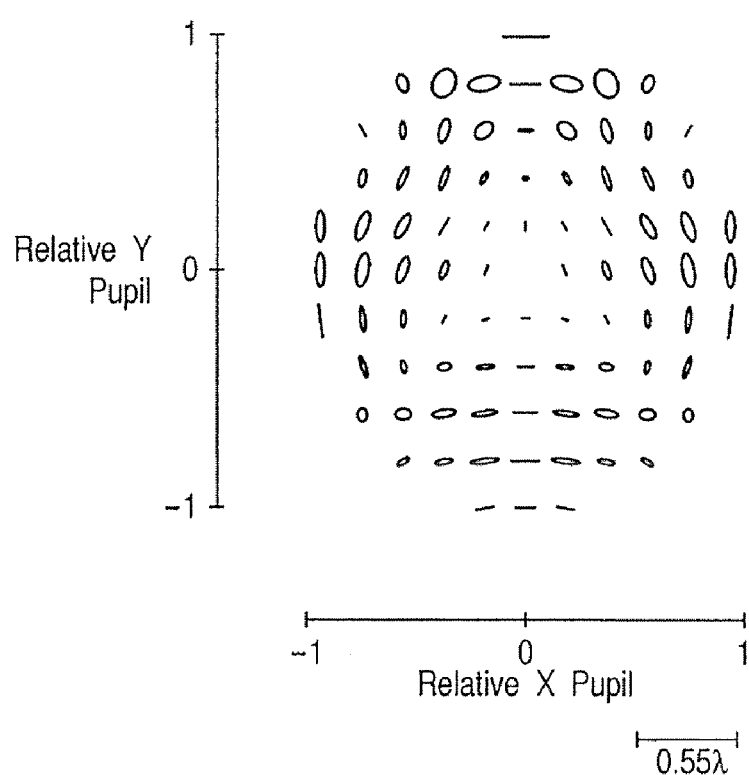

FIGS. 6A and 6B each show a retardance distribution in the pupil, which is formed by the birefringence of the final lens L110 attributed to its crystal structure. FIG. 6A shows a retardance distribution in the pupil when the <1 0 0> crystal axes of each of the parallel plates L111 and L112 and planoconvex lens L113 are oriented along the optical axis AX. FIG. 6B shows a retardance distribution in the pupil in the projection optical system 100 according to the first embodiment. The evaluation image height is set at Y=7.5 mm and X=0.0 mm on the second object plane IMG shown in FIG. 5, which correspond to the slit center.

Consider a case in which the final lens L110 is made of one glass material in which the <1 0 0> crystal axes are oriented along the optical axis AX; that is, the <1 0 0> crystal axes of each of the parallel plates L111 and L112 and planoconvex lens L113 are oriented along the optical axis AX, and all of their assembly angles are set equal around the optical axis. As shown in FIG. 6A, a retardance distribution is generated with an RMS for the average value of retardance in the pupil as large as 0.26λ. To correct such a large retardance, LuAG must be used for many of optical members other than the final lens L110. However, since LuAG has a low transmittance with respect to light having a wavelength of 193 nm and a desired surface accuracy is difficult to obtain by polishing, it is desirable to avoid using LuAG for many components.

As described above, the final lens L110 of the projection optical system 100 according to the first embodiment includes a plurality of members which contain LuAG and have different crystal axes oriented along the optical axis AX, and their assembly angles around the optical axis are prescribed. As shown in FIG. 6B, the overall retardance of the final lens L110 is an RMS of 0.046λ for the average value of retardance in the pupil, which is less than or equal to ⅕ that in FIG. 6A. In view of this, CaF$_2$, BaLiF$_3$, or the like is used for optical members other than the final lens L110. CaF$_2$ has a maximum birefringence of 3.4 nm/cm attributed to its crystal structure. BaLiF$_3$ has a characteristic similar to that of CaF$_2$ and has a maximum birefringence of 25 nm/cm attributed to its crystal structure. This makes it possible to correct the birefringence of the final lens L110 attributed to its crystal structure. It is also possible to correct the birefringence of the final lens L111 attributed to its crystal structure using the birefringence of a thin film (antireflection film) formed on the surface of a lens to prevent reflection, and the residual stress birefringence of a glass material.

In this embodiment, the aspherical lens L120 is made of CaF$_2$, and its <1 1 1> crystal axes are oriented along the optical axis AX (optical axis direction). The aspherical lens L120 and planoconvex lens L113 are arranged such that the relative angle between images of crystal planes along the <1 0 0> crystal axes of the aspherical lens L120 and planoconvex lens L113, which are projected onto a plane perpendicular to the optical axis, becomes 0° around the optical axis.

The difference between the maximum angle θ4 between the optical axis AX and a light beam passing through the aspherical lens L120 and the maximum angle between the optical axis AX and a light beam passing through each of the parallel plates L111 and L112 and planoconvex lens L113 is several degrees, which satisfies inequality (3).

When the projection optical system 100 according to the first embodiment satisfies inequality (3), it is possible to decrease the angular difference between the optical axis AX and a light beam passing through each of the final lens L110 and aspherical lens L120, as in inequality (2). In the first embodiment, the <1 1 1> crystal axes of the aspherical lens L120 are oriented along the optical axis AX so that a retardance distribution component attributed to the <1 1 1> crystal axes, which cannot be corrected even by separating the final lens L110, is corrected supplementarily. Consider a case in which the projection optical system does not satisfy inequality (3), and the angular difference between the optical axis AX and a light beam passing through each of the final lens L110 and aspherical lens L120 increases by a considerable degree. In the retardance distribution in the pupil of a light beam corresponding to each image point, the retardance distribution component of an optical member of the final lens L110, in which the <1 1 1> crystal axes are oriented along the optical axis AX, greatly differs from the retardance distribution component of the aspherical lens L120. This reduces an effect of defining the crystal axes (crystal orientation) and assembly angle of the aspherical lens L120 and correcting the birefringence of the final lens L110, and it becomes difficult to satisfactorily cancel the birefringences. In contrast, since the projection optical system 100 according to the first embodiment satisfies inequality (3), the passage angles of light beams with respect to the final lens L110 and aspherical lens L120 become nearly equal to each other. This makes it possible to efficiently correct the birefringence of the final lens L110 attributed to its crystal structure.

Figure 7A:
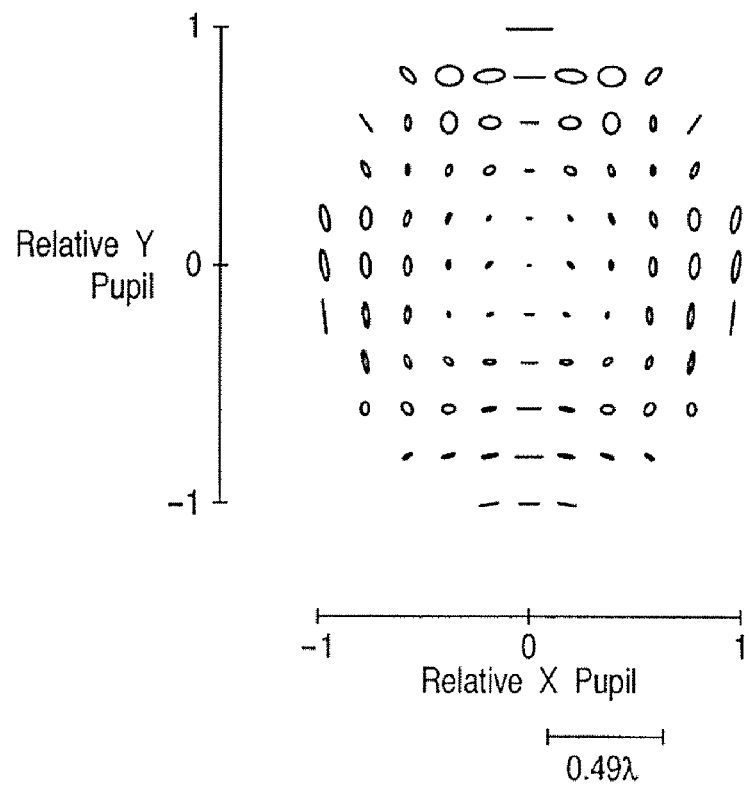
FIGS. 7A and 7B are diagrams each showing a retardance distribution in the pupil, which is formed by the birefringence of the projection optical system according to the first embodiment attributed to its crystal structure.
Figure 7B:
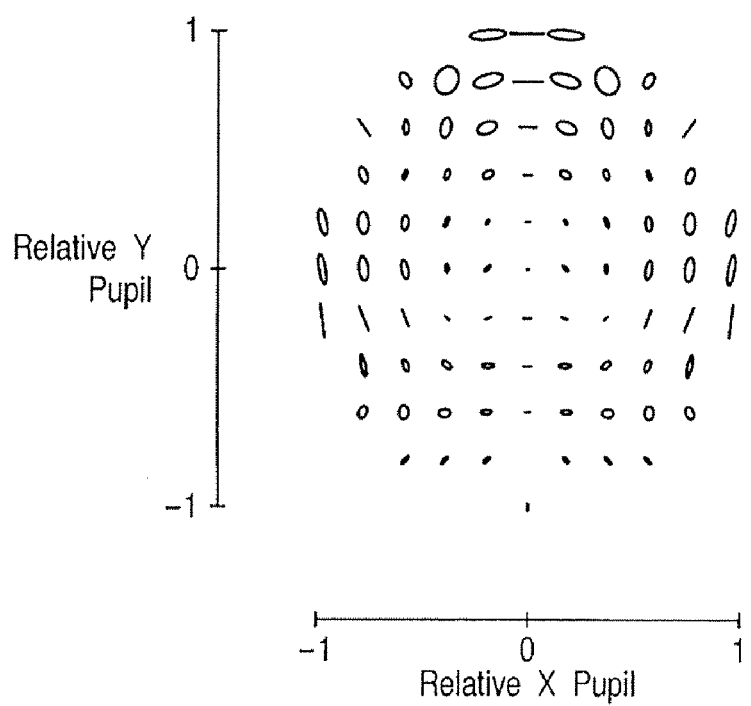

FIGS. 7A and 7B each show a retardance distribution in the pupil, which is formed by the birefringence of the projection optical system 100 according to the first embodiment attributed to its crystal structure. FIG. 7A shows a retardance distribution in the pupil at an image height of Y=7.5 mm and X=0.0 (corresponding to the slit center) on the second object plane IMG shown in FIG. 5. FIG. 7B shows a retardance distribution in the pupil at an image height of Y=7.5 mm and X=13 mm (corresponding to the slit edge) on the second object plane IMG shown in FIG. 5. Referring to FIGS. 7A and 7B, the RMS for the average value of retardance in the pupil is corrected to 42.5 mλ at the slit center and to 43.6 mλ at the slit edge.

In this manner, the projection optical system 100 according to the first embodiment can prevent an increase in cost and achieve excellent imaging performance by reducing the influence of birefringence attributed to the crystal structure. However, the arrangement of the parallel plates L111 and L112 and planoconvex lens L113 of the final lens L110 is not particularly limited to that shown in the first embodiment. For example, it is only necessary that the <1 1 1> crystal axes of two optical members of the final lens L110 are oriented along the optical axis AX, while the <1 0 0> crystal axes of the remaining one optical member are oriented along the optical axis AX. An optimal assembly angle of each optical member is set as needed. The crystal axes, glass material, curve, thickness, and the like of each optical member of the final lens L111 are also set as needed. The number of optical members of the final lens L110 is not particularly limited to three; that is, it is not particularly limited to the parallel plates L111 and L112 and planoconvex lens L113. The final lens L110 may be formed by four optical members by adding an optical member made of an isotropic crystal to the three optical members.

Figure 8:
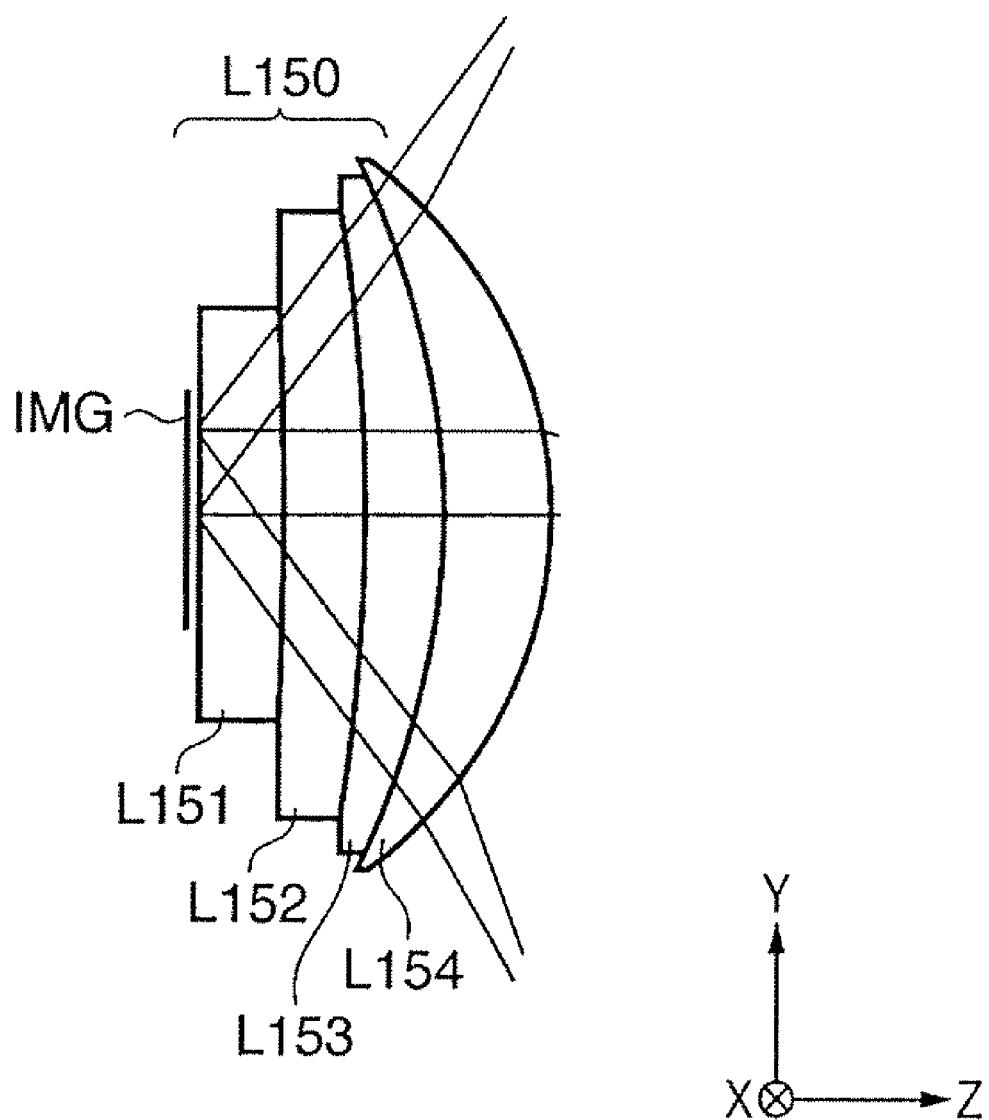
FIG. 8 is a schematic sectional view of a projection optical system according to a second embodiment of the present invention.

FIG. 8 is a schematic sectional view of a projection optical system 100 according to a second embodiment. FIG. 8 shows lenses near a second object plane (wafer surface), which form the projection optical system 100. The projection optical system 100 according to the second embodiment is a catadioptric system which has a numerical aperture (NA) of 1.70 and includes a plurality of lenses and at least one reflecting member. The projection optical system 100 according to the second embodiment includes a final lens (lens group) L150 including convex lenses L151, L152, L153, and L154 inserted in turn from the side of the second object plane IMG. The convex lenses L151, L152, L153, and L154 are made of LuAG. Other lenses (not shown) of the projection optical system 100 according to the second embodiment are made of quartz.

The projection optical system 100 according to the second embodiment can use an image height ranging from 3.125 mm to 16.5 mm (an object height ranging from 12.5 mm to 66.0 mm), ensuring a slit effective area of 26×7 mm. The numerical specification of the projection optical system 100 according to the second embodiment is shown in the following Table 3. Referring to Table 3, the first column shows the surface number assigned along a direction opposite to the direction the light travels from the second object plane IMG. The second column shows the radius (mm) of curvature of each surface corresponding to the surface number. The third column shows the on-axis interval (mm) of each surface. The fourth column shows the type of glass material of each surface.

TABLE 3

NA = 1.70, (maximum image height) = 16.5 mm

| surface number | radius of curvature | on-axis interval | type of glass material | |
|---|---|---|---|---|
| 1 | second object plane | 0.50000 | | |
| 2 | flat | 16.500000 | LuAG | L151 |
| 3 | 500.00000 | 0.000000 | | |
| 4 | 500.00000 | 16.500000 | LuAG | L152 |
| 5 | 400.00000 | 0.000000 | | |
| 6 | 400.00000 | 16.500000 | LuAG | L153 |
| 7 | 150.00000 | 0.000000 | | |
| 8 | 150.00000 | 21.000000 | LuAG | L154 |
| 9 | 84.86056 | 1.000000 | | |

In the projection optical system 100 according to the second embodiment, the space between the second object plane IMG and the final lens L150 (convex lens L151) is filled with a liquid having a refractive index of 1.80.

As described above, the final lens L150 is a lens group which includes the four convex lenses L151 to L154 and has a positive focal length as a whole. The convex lenses L151, L152, L153, and L154 of the projection optical system 100 according to the second embodiment are bonded by optical contact.

As described above, the convex lenses L151 to L154 of the projection optical system 100 according to the second embodiment are made of LuAG having a refractive index of 2.14 with respect to light having a wavelength of 193 nm.

All of the maximum angles between the optical axis AX and light beams passing through the convex lenses L151 to L154 are 52.6°. The maximum angles θ1, θ2, θ3, and θ4 in the convex lenses L151, L152, L153, and L154, respectively, satisfy:

$$|\theta i - \theta j| < 5° \ (i,j=1,2,3,4) \quad (5)$$

The <1 1 1> crystal axes of the convex lens L151 are oriented along the optical axis AX (optical axis direction). An image of a crystal plane along the <1 0 0> crystal axes of the convex lens L151, which is projected onto a plane perpendicular to the optical axis, is oriented in the Y-axis direction shown in FIG. 8. In FIG. 8, a right-handed coordinate system is defined such that the direction perpendicular to the paper is the X-axis (the direction coming out of the paper is the plus direction).

The <1 1 1> crystal axes of the convex lens L152 are oriented along the optical axis AX (optical axis direction). The convex lenses L151 and L152 are arranged such that the relative angle between images of crystal planes along the <1 0 0> crystal axes of the convex lenses L151 and L152, which are projected onto a plane perpendicular to the optical axis, becomes 60° around the optical axis.

The <1 0 0> crystal axes of the convex lens L153 are oriented along the optical axis AX (optical axis direction). The convex lenses L152 and L153 are arranged such that the relative angle between images of crystal planes along the <1 0 0> crystal axes of the convex lens L152 and the <0 1 0> crystal axes of the convex lens L153, which are projected onto a plane perpendicular to the optical axis, becomes 0° around the optical axis.

The <1 0 0> crystal axes of the convex lens L154 are oriented along the optical axis Ax (optical axis direction). The convex lenses L153 and L154 are arranged such that the relative angle between crystal planes along the <0 1 0> crystal axes of the convex lenses L153 and L154, becomes 45° around the optical axis.

With the above-described arrangement, the projection optical system 100 according to the second embodiment can reduce the birefringence of the final lens L150 attributed to its crystal structure.

Figure 9A:
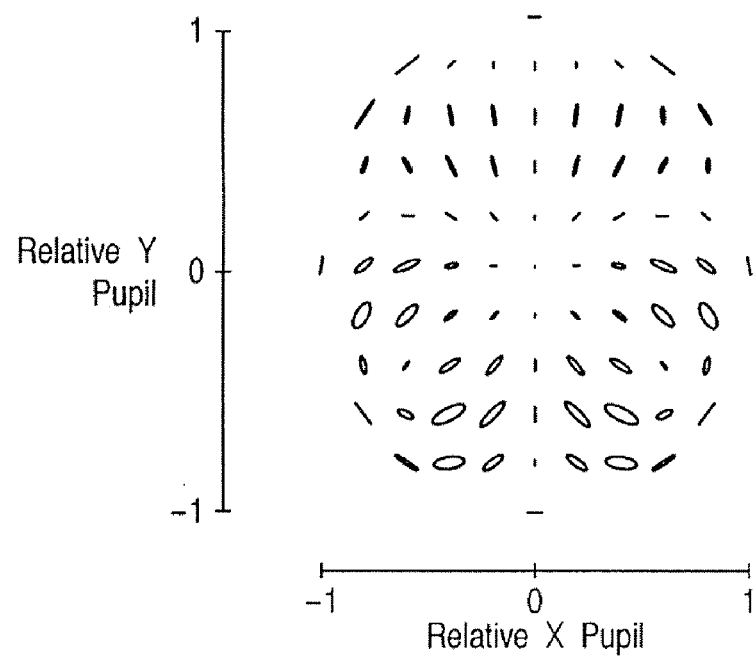
FIGS. 9A and 9B are diagrams each showing a retardance distribution in the pupil, which is formed by the birefringence of the projection optical system according to the second embodiment attributed to its crystal structure.
Figure 9B:
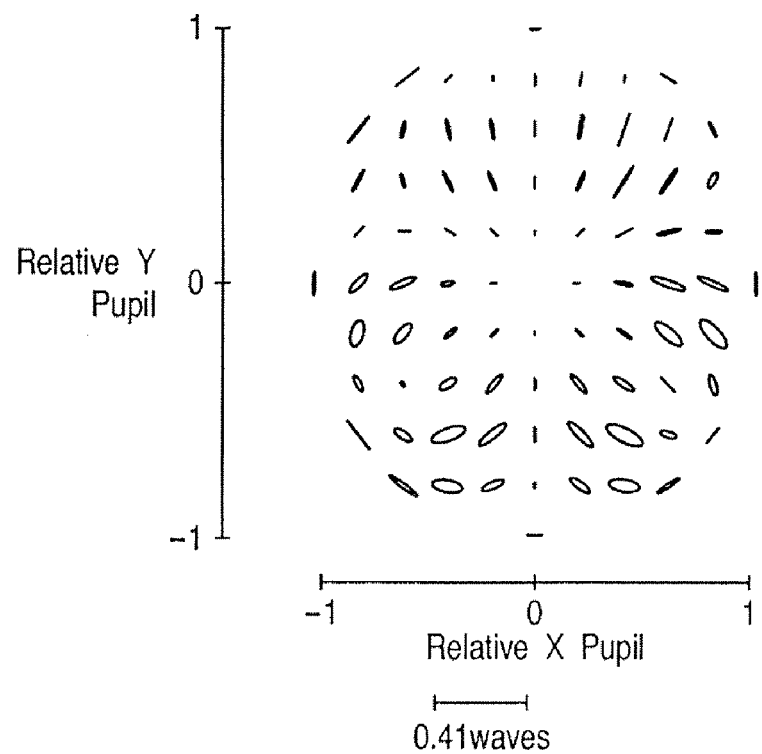

FIGS. 9A and 9B each show a retardance distribution in the pupil, which is formed by the birefringence of the projection optical system 100 according to the second embodiment attributed to its crystal structure. FIG. 9A shows a retardance distribution in the pupil at an image height of Y=6.0 mm and X=0.0 (corresponding to the slit center) on the second object plane IMG shown in FIG. 8. FIG. 9B shows a retardance distribution in the pupil at an image height of Y=6.0 mm and X=13 mm (corresponding to the slit edge) on the second object plane IMG shown in FIG. 5. Referring to FIGS. 9A and 9B, the RMS for the average value of retardance in the pupil is corrected to 40.6 mλ at the slit center and to 43.4 mλ at the slit edge.

In this manner, the projection optical system 100 according to the second embodiment can prevent an increase in cost and achieve excellent imaging performance by reducing the influence of birefringence attributed to the crystal structure. However, the present invention does not limit the order of crystal axes as long as the <1 1 1> crystal axes of two optical members of the final lens L150 are oriented along the optical axis AX and the <1 0 0> crystal axes of the remaining two optical members are oriented along the optical axis AX. An optimal assembly angle of each optical member is set as needed. The crystal axes, glass material, curve, thickness, and the like of each optical member of the final lens L150 are also set as needed.

Figure 10:
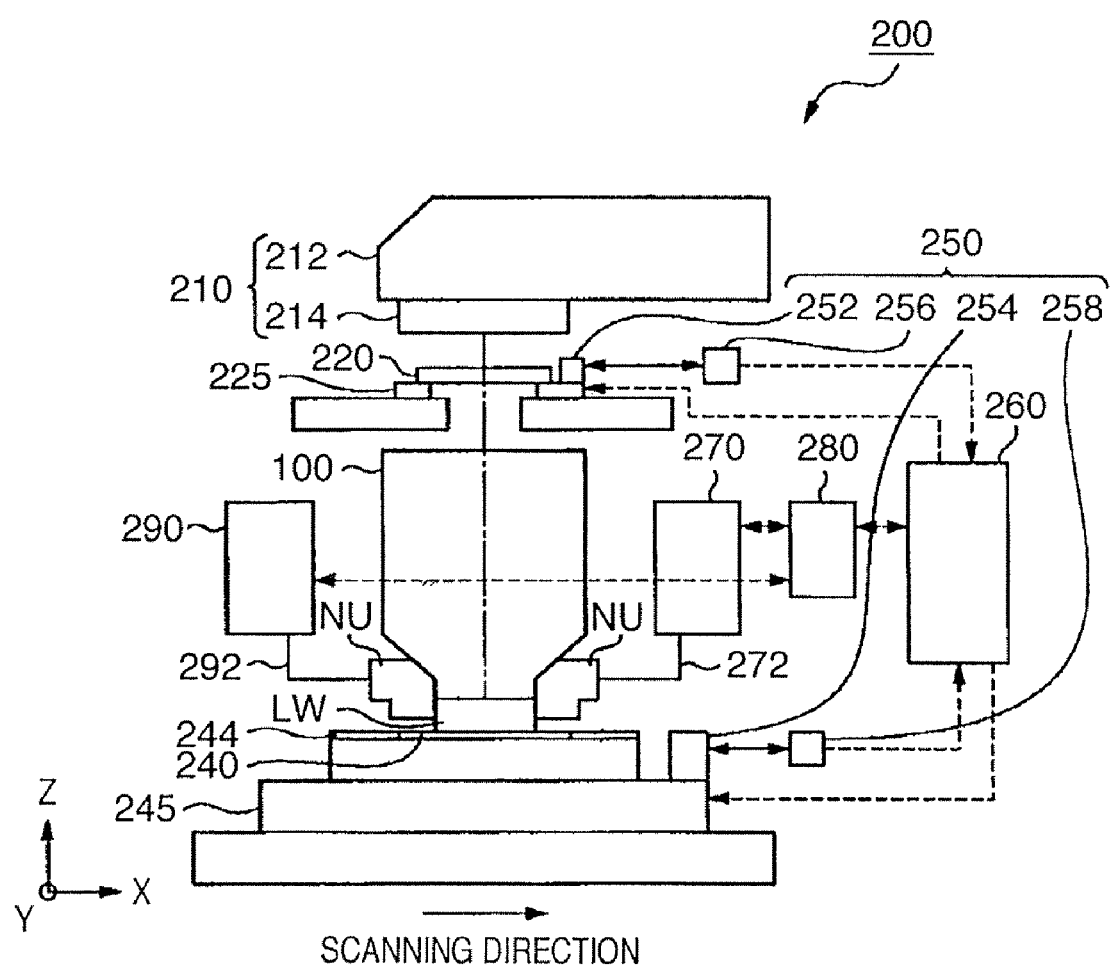
FIG. 10 is a schematic sectional view of an exposure apparatus according to one aspect of the present invention.

An exposure apparatus 200 to which a projection optical system 100 according to the present invention is applied will be explained below with reference to FIG. 10. FIG. 10 is a schematic sectional view of the exposure apparatus 200 according to the present invention.

The exposure apparatus 200 is an immersion exposure apparatus which transfers the pattern of a reticle 220 onto a wafer 240 by exposure using a step & scan scheme via a liquid LW supplied between the projection optical system 100 and the wafer 240.

As shown in FIG. 10, the exposure apparatus 200 includes an illumination unit 210, a reticle stage 225 which mounts the reticle 220, the projection optical system 100, a wafer stage 245 which mounts the wafer 240, a distance measurement unit 250, and a stage control unit 260. The exposure apparatus 200 also includes a liquid supply unit 270, immersion control unit 280, liquid recovery unit 290, and nozzle unit NU.

The illumination unit 210 includes a light source unit 212 and illumination optical system 214. In this embodiment, an ArF excimer laser having a wavelength of 193 nm is used as a light source of the light source unit 212.

The illumination optical system 214 illuminates the reticle 220 with light from the light source unit 212.

The reticle 220 is transported from the outside of the exposure apparatus 200 by a reticle transport system (not shown) and supported and driven by the reticle stage 225.

The reticle stage 225 supports the reticle 220 via a reticle chuck (not shown) and is controlled by the stage control unit 260.

The projection optical system 100 projects a pattern image on the reticle 220 as the first object plane onto the wafer 240 as the second object plane. The projection optical system 100 can take any of the above-described forms, and a detailed description thereof will be omitted here. However, the projection optical system 100 is applicable to an apparatus other than an immersion exposure apparatus.

In this embodiment, the wafer 240 is used as the substrate. However, it is also possible to use other substrates such as a glass plate in place of the wafer 240. The wafer 240 is coated with a photoresist.

A liquid holding unit 244 is arranged around the wafer 240 supported by the wafer stage 245. The liquid holding unit 244 is a plate having a surface flush with that of the wafer 240. The liquid holding unit 244 holds the liquid LW in a region outside the wafer 240 in exposing a shot region near the periphery of the wafer 240.

The distance measurement unit 250 measures the positions of the reticle stage 225 and wafer stage 245 using reference mirrors 252 and 254 and laser interferometers 256 and 258 in real time. The distance measurement result obtained by the distance measurement unit 250 is sent to the stage control unit 260.

Based on the measurement result obtained by the distance measurement unit 250, the stage control unit 260 performs control to drive the reticle stage 225 and wafer stage 245 to align and synchronously control the reticle 220 and wafer 240.

The liquid supply unit 270 supplies the liquid LW to the space or gap between the wafer 240 and a final lens of the projection optical system 100. The liquid supply unit 270 includes a liquid supply pipe 272. The liquid supply unit 270 supplies the liquid LW to that space via the liquid supply pipe 272 arranged around the final lens of the projection optical system 100. With this operation, a thin liquid film is formed in the space between the projection optical system 100 and the wafer 240 by the liquid LW.

The immersion control unit 280 acquires information about, for example, the current position, velocity, and acceleration of the wafer stage 245 from the stage control unit 260, and performs control associated with immersion exposure based on the acquired information.

The liquid recovery unit 290 has a function of recovering the liquid LW supplied between the projection optical system 100 and the wafer 240 by the liquid supply unit 270, and includes a liquid recovery pipe 292. The liquid recovery pipe 292 recovers, via a liquid recovery port formed in the nozzle unit NU, the liquid LW supplied between the projection optical system 100 and the wafer 240 by the liquid supply unit 270.

A liquid supply port and liquid recovery port are formed in the nozzle unit NU on the side of the wafer 240. The liquid supply port is used to supply the liquid LW and connects to the liquid supply pipe 272. The liquid recovery port is used to recover the supplied liquid LW and connects to the liquid recovery pipe 292.

In exposure, the illumination optical system 214 illuminates the reticle 220 with a light beam emitted by the light source unit 212. The projection optical system 100 images the pattern of the reticle 220 on the wafer 240 via the liquid LW. The projection optical system 100 used for the exposure apparatus 200 can provide devices (e.g., a semiconductor device, an LCD device, an image sensing device (e.g., a CCD), and a thin-film magnetic head) with high throughput, high quality, and good economical efficiency.

Figure 11:
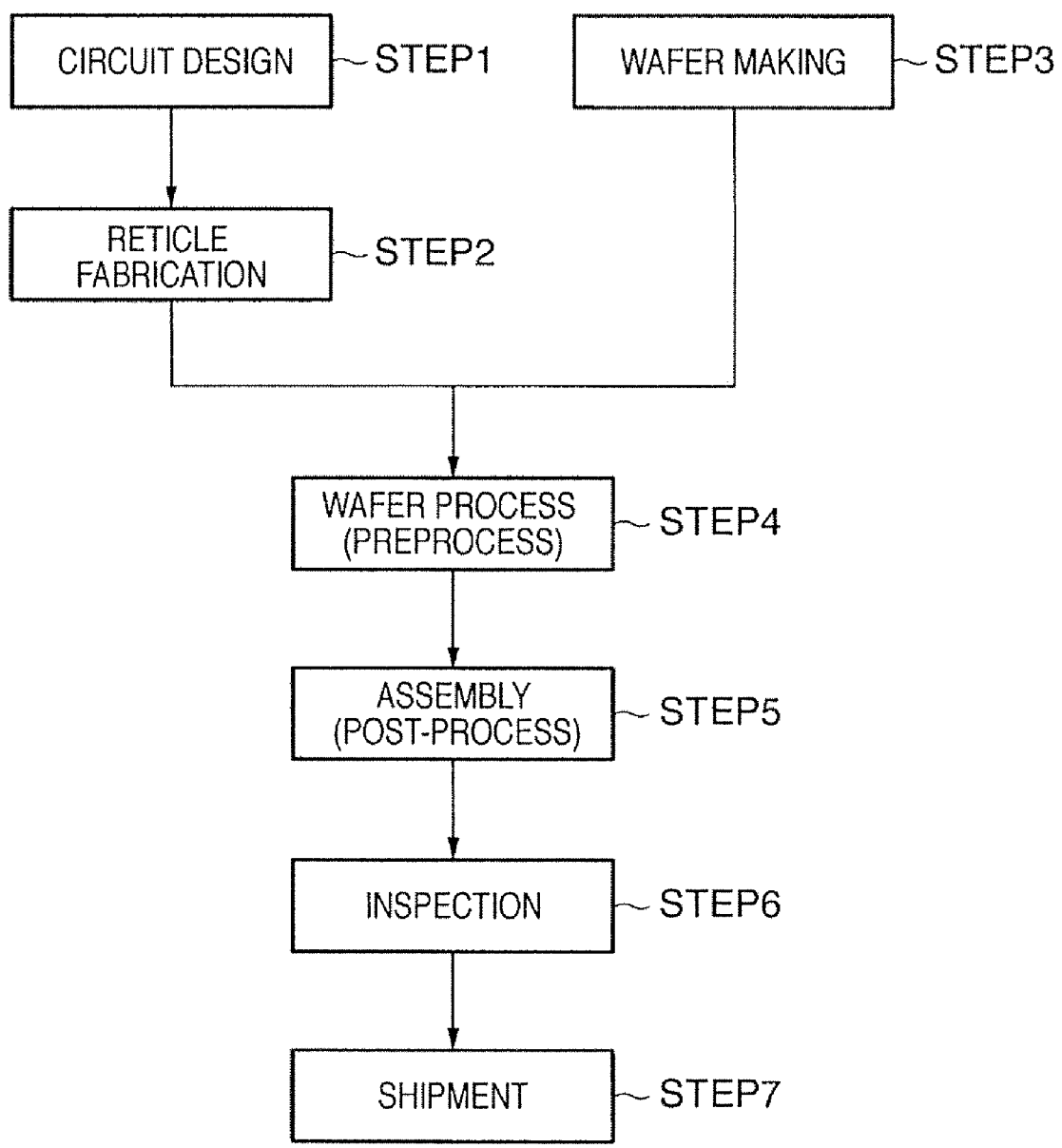
FIG. 11 is a flowchart for explaining a method for fabricating devices.
Figure 12:
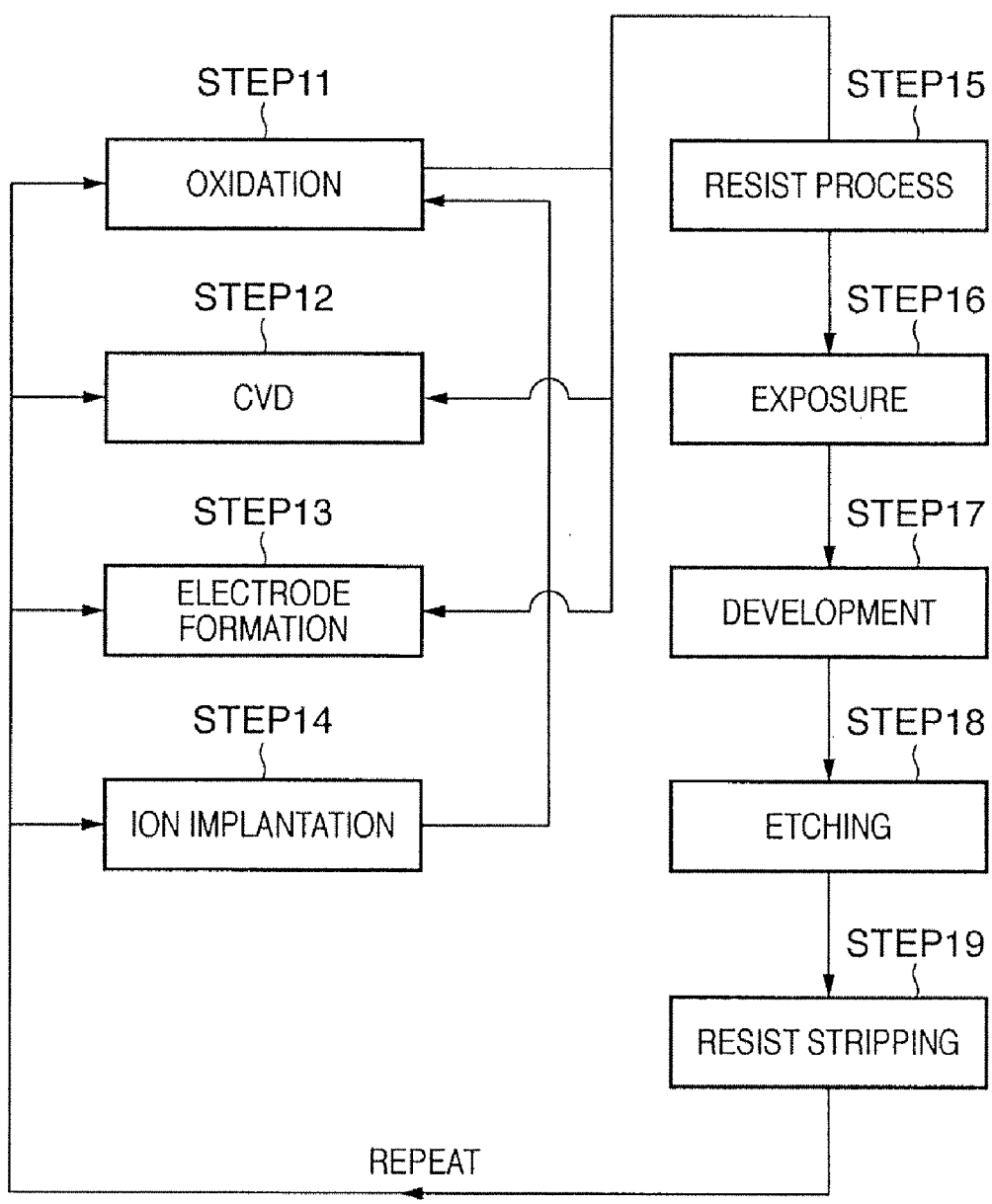
FIG. 12 is a detail flowchart of a wafer process in Step 4 of FIG. 10.
Figure 13:
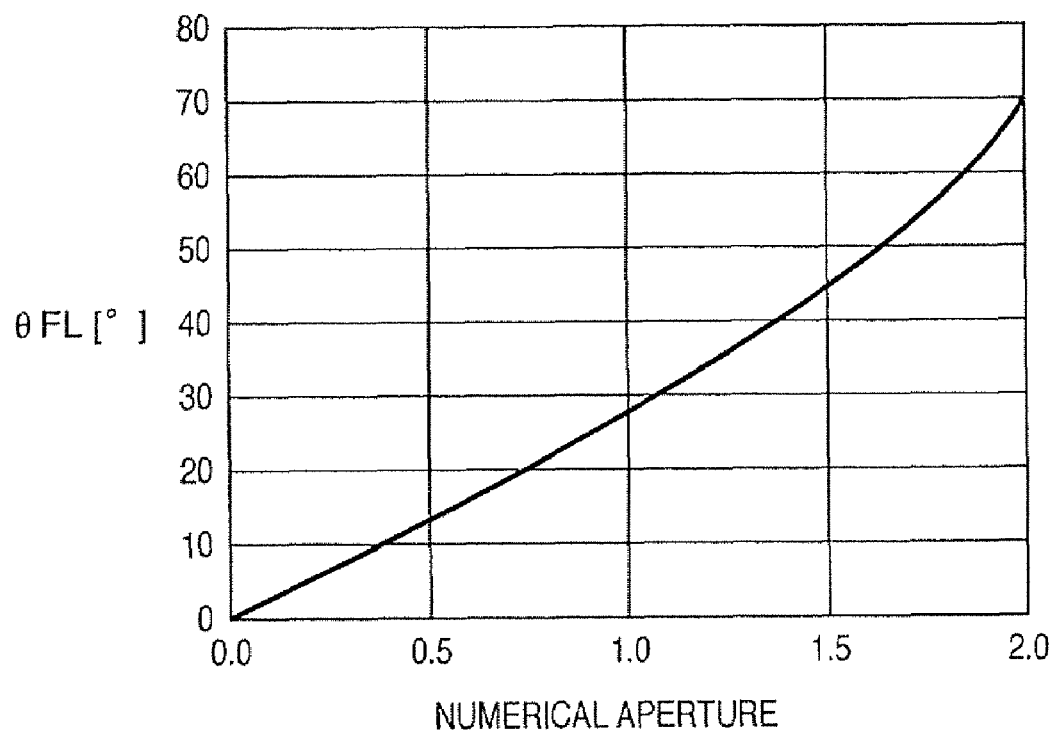
FIG. 13 is a graph showing the dependence of an angle $\theta FL$ between the optical axis of a projection optical system and a light beam passing through a final lens upon the numerical aperture when the glass material of the final lens is LuAG (refractive index: 2.14).

Referring now to FIGS. 11 and 12, a description will be given of an embodiment of a device fabrication method using the above mentioned exposure apparatus 200. FIG. 11 is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (reticle fabrication) forms a reticle having a designed circuit pattern. Step 3 (wafer making) manufactures a wafer using materials such as silicon. Step 4 (wafer process), which is also referred to as a pretreatment, forms the actual circuitry on the wafer through lithography using the reticle and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 12 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 200 to expose a circuit pattern from the reticle onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. The device fabrication method of this embodiment may manufacture higher quality devices than the conventional one. Thus, the device fabrication method using the exposure apparatus 200, and resultant devices constitute one aspect of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese application No. 2007-051936 filed on Mar. 1, 2007, which is hereby incorporated by reference herein in its entirely.

What is claimed is:

1. A projection optical system which projects an image on a first object plane onto a second object plane, comprising
   a plurality of optical members inserted in turn from a side of the second object plane,
   said plurality of optical members being made of an isotropic crystal and including a first optical member and second optical member in each of which <1 1 1> crystal axes are oriented in a direction of an optical axis and a third optical member in which <1 0 0> crystal axes are oriented in the direction of the optical axis,
   wherein maximum angles θ1, θ2, and θ3 between the optical axis and light beams passing through said first optical member, said second optical member, and said third optical member, respectively, satisfy:

$|\theta i - \theta j| < 5°$ $(i, j=1,2,3)$.

2. The system according to claim 1, wherein said plurality of optical members are bonded by optical contact.

3. The system according to claim 1, wherein said plurality of optical members include a lens having a positive focal length and a parallel plate.

4. The system according to claim 3, wherein said lens and said parallel plate are made of identical isotropic crystals.

5. The system according to claim 1, wherein said plurality of optical members essentially consists of LuAG.

6. The system according to claim 2, wherein each of said plurality of optical members is a convex lens.

7. An exposure apparatus comprising:
   an illumination optical system configured to illuminate a reticle with light from a light source; and
   a projection optical system according to claim 1, which is configured to project a pattern image of the reticle onto a substrate.

8. The apparatus according to claim 7, further comprising a liquid supply unit configured to supply a liquid between said projection optical system and the substrate.

9. A device fabrication method comprising steps of:
   exposing a substrate using an exposure apparatus according to claim 7; and
   performing a development process for the substrate exposed.

10. A projection optical system which projects an image on a first object plane onto a second object plane, comprising
    a plurality of optical members inserted in turn from a side of the second object plane,
    said plurality of optical members being made of an isotropic crystal and including a first optical member and second optical member in each of which <1 1 1> crystal axes are oriented in a direction of an optical axis and a third optical member and fourth optical member in each of which <1 0 0> crystal axes are oriented in the direction of the optical axis,
    wherein maximum angles $\theta 1$, $\theta 2$, $\theta 3$, and $\theta 4$ between the optical axis and light beams passing through said first optical member, said second optical member, said third optical member, and said fourth optical member, respectively, satisfy:

$|\theta i - \theta j| < 5°$ $(i,j=1,2,3,4)$.

11. An exposure apparatus comprising:
    an illumination optical system configured to illuminate a reticle with light from a light source; and
    a projection optical system according to claim 10, which is configured to project a pattern image of the reticle onto a substrate.

12. The apparatus according to claim 11, further comprising a liquid supply unit configured to supply a liquid between said projection optical system and the substrate.

13. A device fabrication method comprising steps of:
    exposing a substrate using an exposure apparatus according to claim 11; and
    performing a development process for the substrate exposed.

* * * * *